US008258578B2

(12) United States Patent
    Carlson

(10) Patent No.:  US 8,258,578 B2
(45) Date of Patent:  Sep. 4, 2012

(54) HANDSHAKE STRUCTURE FOR IMPROVING LAYOUT DENSITY

(75) Inventor: Andrew E. Carlson, Franklin, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 377 days.

(21) Appl. No.: 12/551,019

(22) Filed: Aug. 31, 2009

(65) Prior Publication Data
    US 2011/0049635 A1   Mar. 3, 2011

(51) Int. Cl.
    *H01L 21/28*  (2006.01)
(52) U.S. Cl. . 257/368; 257/208; 257/330; 257/E21.158; 257/E27.06; 438/585
(58) Field of Classification Search .................. 257/208, 257/330, 368; 438/585
    See application file for complete search history.

(56) References Cited

U.S. PATENT DOCUMENTS

| 2004/0029327 | A1 | 2/2004 | Oyamatsu |
| 2005/0258498 | A1 | 11/2005 | Suzuki |
| 2006/0138561 | A1 | 6/2006 | Seo |
| 2007/0228435 | A1* | 10/2007 | Ho et al. ........................ 257/296 |
| 2010/0015789 | A1* | 1/2010 | Moritoki ........................ 438/586 |

FOREIGN PATENT DOCUMENTS

| JP | 10 065027 | 3/1998 |
| WO | 2006/109363 | 10/2006 |

OTHER PUBLICATIONS

International Search Report in application No. PCT/US2010/046254 mailed Nov. 16, 2010.

* cited by examiner

*Primary Examiner* — A. Sefer
(74) *Attorney, Agent, or Firm* — Meyertons, Hood, Kivlin, Kowert & Goetzel, P.C.; Gareth M. Sampson

(57) ABSTRACT

A semiconductor device includes a gate on a semiconductor substrate. One side wall of the gate may include at least one protrusion and an opposite side wall of the gate may include at least one depression. A contact is formed through an insulating layer disposed over the gate. The contact at least partially overlaps at least one of the protrusions in the gate. A metal layer is disposed on the insulating layer. The metal layer includes a first structure shifted to a first side of the gate. The first structure at least partially overlaps the contact such that the contact electrically couples the first structure to the gate through the insulating layer.

23 Claims, 6 Drawing Sheets

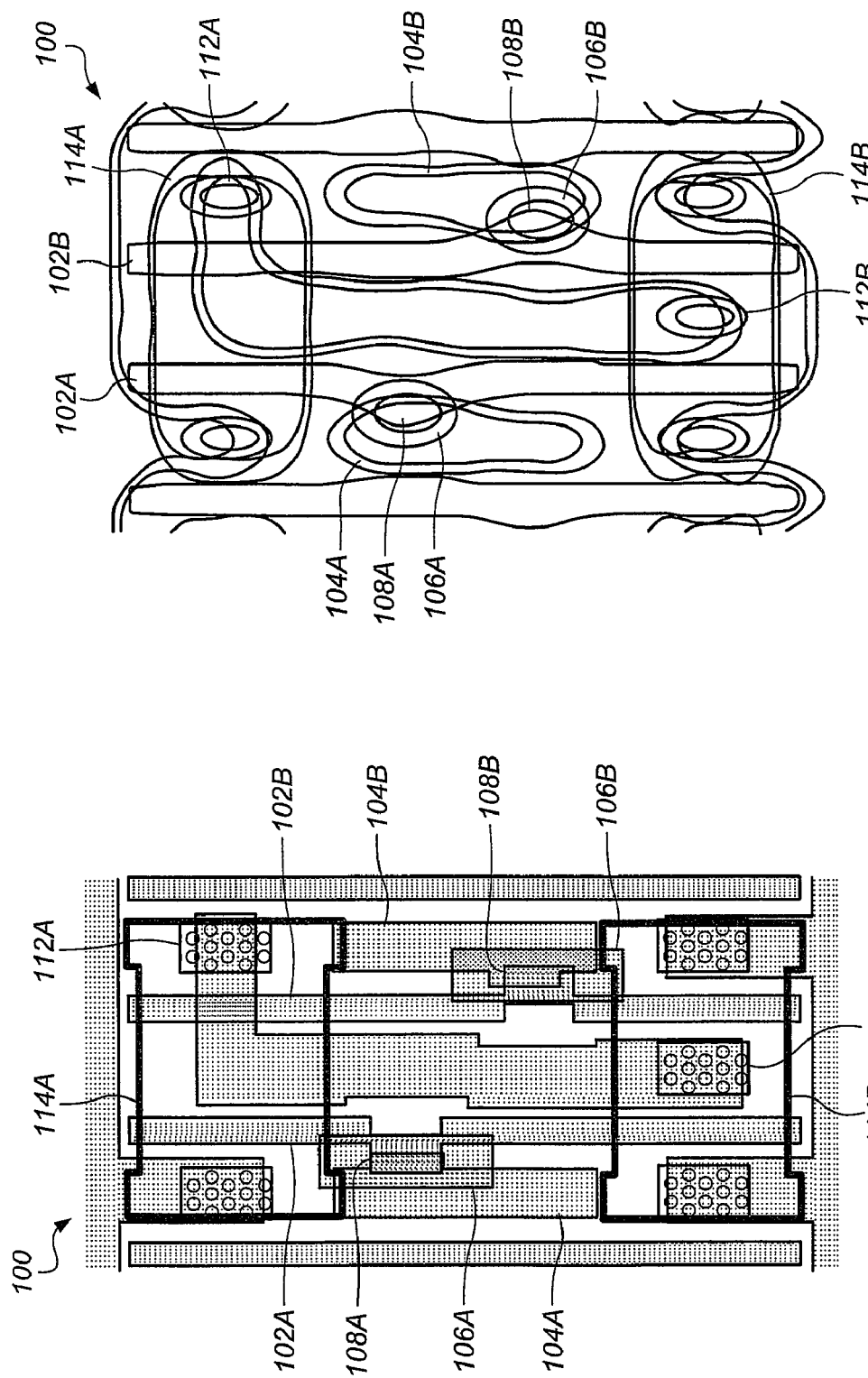

HANDSHAKE STRUCTURE FOR IMPROVING LAYOUT DENSITY

BACKGROUND OF THE INVENTION

1. Field of the Invention

This invention relates generally to semiconductor processes for forming transistors and, more specifically, to processes for increasing layout density on a semiconductor substrate.

2. Description of the Related Art

Transistors such as planar transistors have been the core of integrated circuits for several decades. During the use of transistors, the size of the individual transistors has steadily decreased through advances in process development and the need to increase feature density. Current scaling employs 32 nm technologies with development progressing towards 22 nm technologies.

Metal 1 (M1) vertical wire routes used to connect between NMOS and PMOS structures are important in standard transistor cell designs. The M1 vertical wire routes may connect to contacts (outputs) that contact to active areas of the underlying layer. The M1 vertical wire routes may be in addition to other M1 wires that contact to gates.

A first challenge in routing M1 wires (either contact wires or vertical wires) is misalignment, or overlay error. Misalignment is an increasing challenge in modern lithography, which results in certain practical limitations. One practical limitation is that the offset between small contacting features is desired to be kept as small as possible with coinciding centers being preferred. Solving this limitation encourages, for example, that a contact is placed centered over a gate and a thin M1 wire is placed centered over the contact such that the gate, the contact, and the M1 wire are all centered over the same point.

A second challenge is the desire for CPP (contacted poly pitch) to be close to limits of technology (for example, 22 nm design rules). This desire makes it not possible to pattern an additional M1 wire (such as the vertical M1 wire) between two contacted gates when the M1 and the gates are concentric, which is preferred to avoid misalignment as described above. Being able to route the M1 vertical wire between the contacted gates while avoiding misalignment would allow a denser layout, resulting in a lower product cost and faster operation.

FIG. 1 depicts a top view of a device with a contact and a metal layer structure directly over a gate. Layout 100 includes gates 102A, 102B coupled to M1 structures 104A, 104B by contacts 106A, 106B, respectively. M1 structures 104A, 104B are input contacts for gates 102A, 102B. Because of the closeness of M1 structures 104A, 104B, there is no room between the M1 structures for another M1 structure such as an M1 vertical wire route. Area 108 represents the area around M1 structures 104A, 104B that is blocked for placement of other M1 structures due to the density of the layout.

One possible solution to allow for an M1 vertical wire route in layout 100 is to bloat the gate area (CPP bloat) by putting in a dummy gate to increase the horizontal distance between active gates. This method, however, increases the overall chip area and limits the performance of the chip versus chip area.

Another possible solution is to use an extra local interconnect (LI) layer to make the connection to the output instead of the M1 vertical wire route. The LI layer can be used for contacts to gates and/or contacts to active regions. However, the use of the LI layer requires the use of an additional via (V0) layer to inhibit shorting of the LI layer to nearby M1 wires. The additional V0 layer may significantly increase development and/or processing costs.

Another possible solution is to use a wrong way metal 2 (M2) layer where the M2 layer is exposed and the M2 wire in the same direction as the M1 wire. This makes it difficult to route wires from other locations (for example, other logic gates or other parts of the circuit) to connect to the M1 wires. Furthermore, in order to print the M2 at a pitch as tight as the CPP, it is either necessary in the lithography to tradeoff the minimum pitch that can be printed in the orthogonal direction (techniques include, for example, reticle enhancement technologies (RET) and dipole illumination) or to use multiple exposures and multiple masks, which produce a cost and yield penalty. Thus, a wrong way M2 solution has limitations that extend throughout the entire design and compromise the ability to route with high density to M1 wires or the processing cost and yield of the product.

Yet another possible solution is to add a head (or flag) to the gate to transpose the gate connection and allow increased layout density. The contact can then be placed directly over (squared on) the head. Using the head, however, increases the deviation in gate width. This deviation in gate width increases the variation of the critical dimensions and can pose yield and reliability problems.

Thus, there is a need to increase the layout density by allowing M1 vertical wire routing while minimizing development and process costs and maintaining performance and reliability at desired levels. The denser layout with the M1 vertical wire routing may lower product cost and/or increase operating speed of a chip utilizing the denser layout. Such a denser layout may be useful in advanced technologies such as 22 nm technologies to produce faster and more reliable CPUs (central processing units) or GPUs (graphical processing units).

SUMMARY OF EMBODIMENTS OF THE INVENTION

In certain embodiments, a semiconductor device includes a gate on a semiconductor substrate. One side wall of the gate may include at least one protrusion and an opposite side wall of the gate may include at least one depression. An insulating layer may be disposed substantially over the gate. A contact may be formed through the insulating layer. The contact may at least partially overlap at least one of the protrusions in the gate. A metal layer may be disposed on the insulating layer. The metal layer may include a first metal layer structure shifted to a first side of the gate. The first structure may at least partially overlap the contact such that the contact electrically couples the first structure to the gate through the insulating layer.

In certain embodiments, a semiconductor device fabrication process includes forming the gate on the semiconductor substrate with one side wall of the gate including at least one protrusion and an opposite side wall of the gate including at least one depression, forming the insulating layer substantially over the gate, forming the contact through the insulating layer, and forming the metal layer with the first structure on the insulating layer.

In certain embodiments, an integrated circuit includes one or more semiconductor devices. At least one of the semiconductor devices includes the gate with one side wall of the gate including at least one protrusion and an opposite side wall of the gate including at least one depression, the insulating layer disposed substantially over the gate, the contact formed through the insulating layer, and the metal layer with the first structure disposed on the insulating layer.

In certain embodiments, a computer readable storage medium stores a plurality of instructions which, when executed, generate one or more patterns useable to provide a semiconductor device that includes the gate with one side wall of the gate including at least one protrusion and an opposite side wall of the gate including at least one depression, the insulating layer disposed substantially over the gate, the contact formed through the insulating layer, and the metal layer with the first structure disposed on the insulating layer.

In certain embodiments, a computer readable storage medium stores a plurality of instructions which, when executed, generate one or more patterns useable in a semiconductor process that includes forming the gate on the semiconductor substrate with one side wall of the gate including at least one protrusion and an opposite side wall of the gate including at least one depression, forming the insulating layer substantially over the gate, forming the contact through the insulating layer, and forming the metal layer with the first structure on the insulating layer.

BRIEF DESCRIPTION OF THE DRAWINGS

FIG. 4 depicts a retargeted (for optimized process integration) depiction of the layout 100 shown in FIG. 2A.

FIG. 5 depicts an on-wafer depiction of the layout shown in FIG. 2A.

While the invention is described herein by way of example for several embodiments and illustrative drawings, those skilled in the art will recognize that the invention is not limited to the embodiments or drawings described. It should be understood that the drawings and detailed description hereto are not intended to limit the invention to the particular form disclosed, but on the contrary, the invention is to cover all modifications, equivalents and alternatives falling within the spirit and scope of the present invention as defined by the appended claims. Any headings used herein are for organizational purposes only and are not meant to limit the scope of the description or the claims. As used herein, the word "may" is used in a permissive sense (i.e., meaning having the potential to) rather than the mandatory sense (i.e. meaning must). Similarly, the words "include", "including", and "includes" mean including, but not limited to.

DETAILED DESCRIPTION OF THE EMBODIMENTS

Figures 2A, 2B:
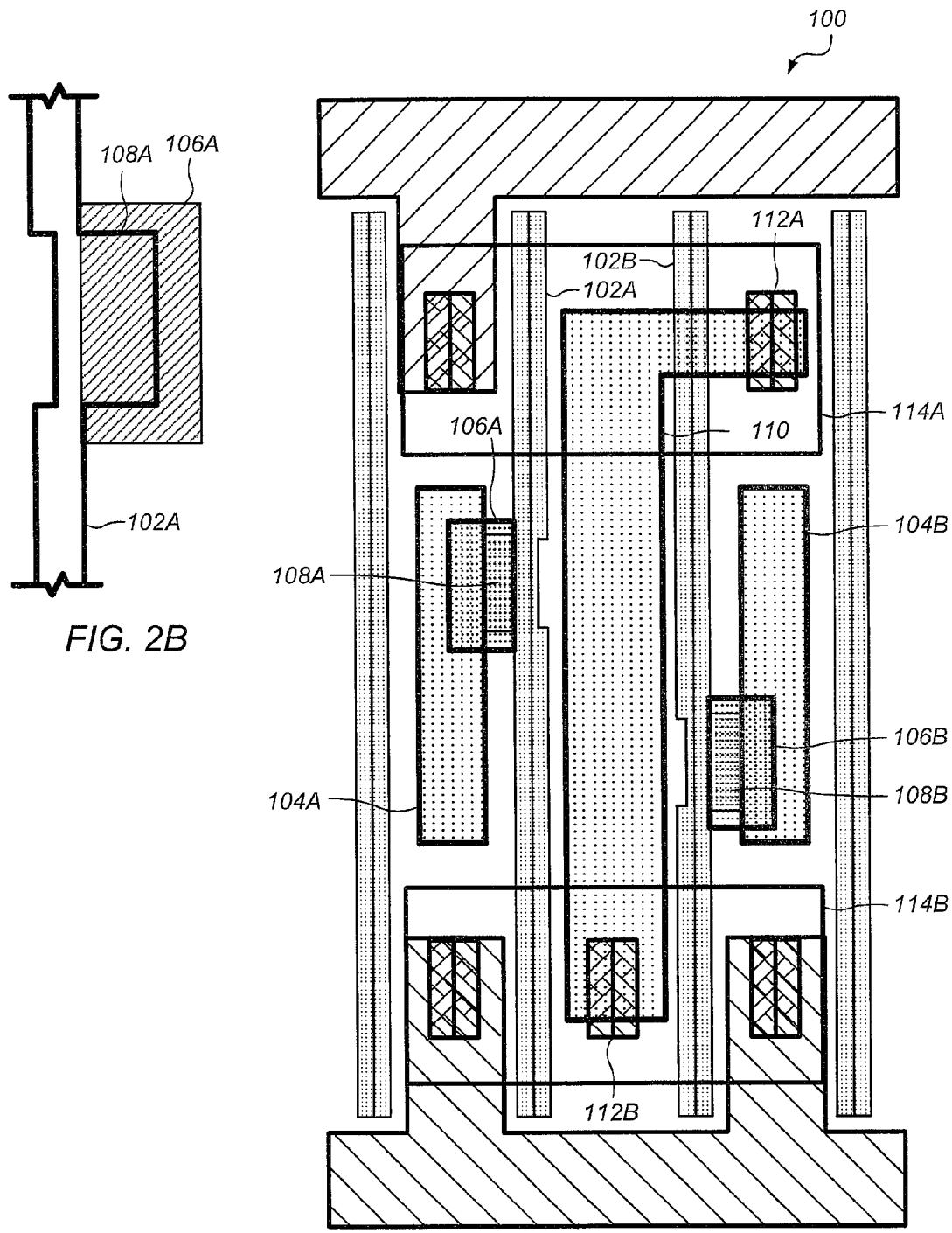
FIG. 2A depicts a top view of an embodiment of a designed layout for a device with a contact and a metal layer structure shifted over a gate with a bend.
FIG. 2B depicts a blown-up view of the gate with the bend and the contact overlaying the bend of the gate.

FIG. 2A depicts a top view of an embodiment of layout 100 for a device with a contact and a metal layer structure shifted over a gate with a bend. Layout 100 may be, for example, used in semiconductor devices such as, but not limited to, central processing units (CPUs) and graphical processing units (GPUs). Layout 100 may be, or be part of, a transistor used in such devices. In some embodiments, layout 100 is an NMOS or PMOS layout or part of an NMOS or PMOS layout. Layout 100 may be a CAD (computer-aided design) designed layout or a layout formed from a CAD designed process. In certain embodiments, a computer readable storage medium stores a plurality of instructions which, when executed, generates layout 100 or patterns used to form layout 100 in a semiconductor process.

In certain embodiments, layout 100 includes gates 102A, 102B. An insulation layer may be deposited over gates 102A, 102B. Contacts 106A, 106B may be formed through the insulation layer to couple to gates 102A, 102B. Contacts 106A, 106B may be input contacts for gates 102A, 102B.

In certain embodiments, gates 102A, 102B include one or more bends 108A, 108B. A "bend" is a portion of a gate that is bent or shifted off-center in one direction (as shown in embodiments depicted herein). For example, the bend portion of the gate has opposite walls that are shifted, displaced, or pushed in one direction such that one side wall of the gate has a protrusion (e.g., projection, bulge, bump, or hump) and the opposite side wall of the gate has a depression (e.g., indentation or dimple). The protrusion and depression may be substantially opposite one another along a portion of the length of the gate. In certain embodiments, the protrusion and depression are substantially opposite one another along a portion but not all of the length of the gate. The protrusion and depression may be located at about the same location along the length of the gate. In some embodiments, the protrusion and depression that form the bend on the substrate are similarly sized and shaped. In some embodiments, the protrusion and the depression that form the bend on the substrate are different in length and/or depth.

It is to be understood that "bend" as described herein refers to the shape created on the substrate surface and is not necessarily the shape or design used to create the shape on the surface. For example, in some embodiments, the bend on the wafer may be formed from different shapes or a collection of shapes. In some embodiments, the bend is formed from rectangular shapes, as shown in FIG. 2A. In other embodiment, the bend is formed from non-rectangular shapes. For example, the bend may be formed from shapes that have features beyond the spatial resolution of the lithography (e.g., sharp corners or narrow spaces) that are smoothed out (e.g., rounded or merged) during processing. For example, in one embodiment, a shape that is disconnected and offset from the remainder of the gate by a distance smaller than the resolution of the lithography may merge with the rest of the gate to form a continuous bend on the substrate. Thus, many different combinations of layout shapes may be used to form similarly shaped bends on the substrate.

FIG. 2B depicts a blown-up view of gate 102A with bend 108A and contact 106A overlaying the bend. As shown in FIGS. 2A and 2B, gate 102A includes full bend 108A (similarly, gate 102B is shown to include full bend 108B in FIG. 2A). As shown in FIG. 2B, bend 108A bends or shifts a portion of gate 102A off-center. In some embodiments (for example, for a cross-coupled device such as a cross-coupled pair of NMOS and PMOS gates), only a ½ bend is needed (the ½ bend shifts the gate such that the remaining portion of the gate is shifted from the portion of the gate before the ½ bend). An example of a ½ bend is shown as reference number 116 in the embodiment depicted in FIG. 7.

Figure 1:
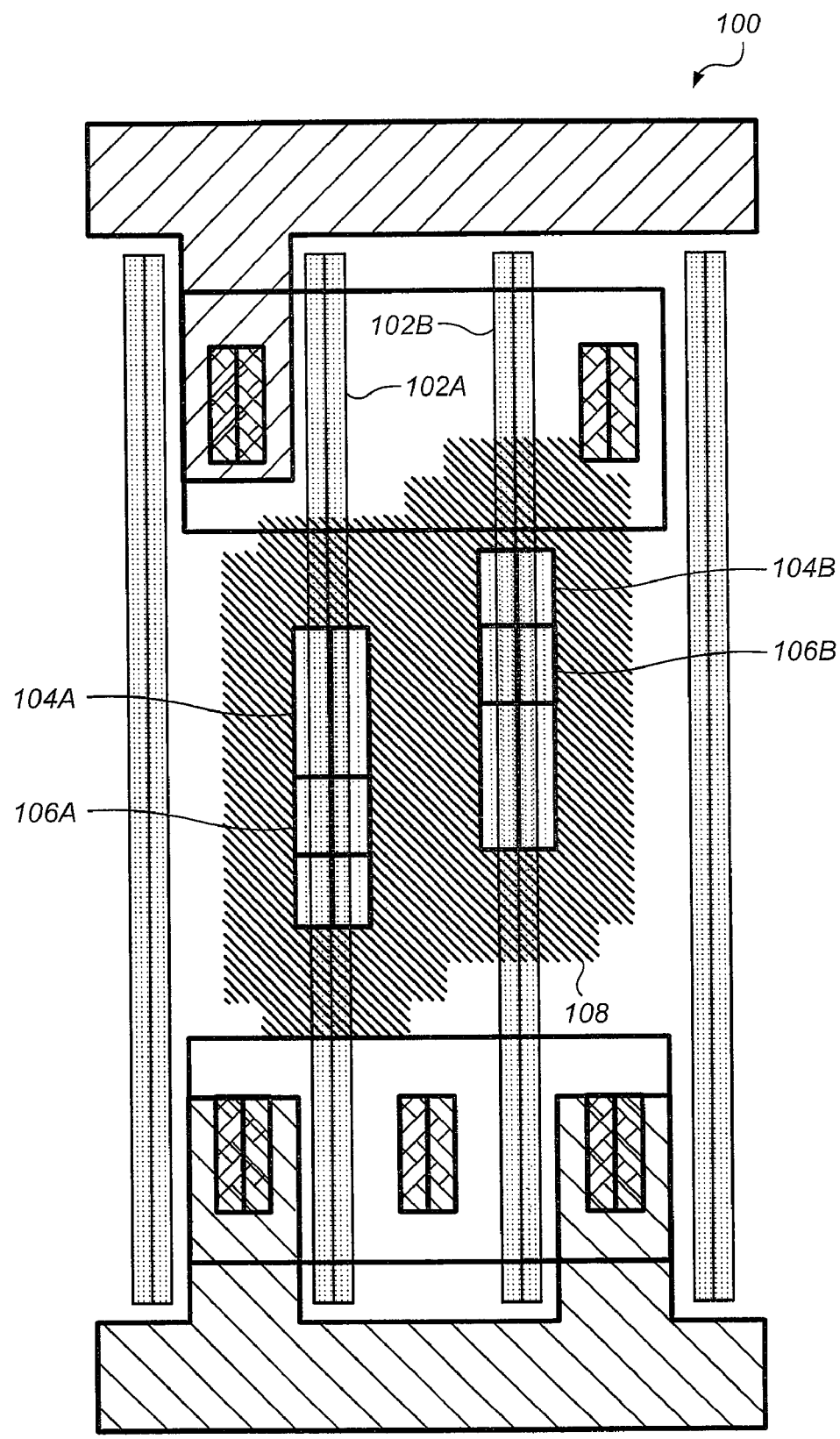
FIG. 1 depicts a top view of a prior art device with a contact and a metal layer structure directly over a gate.

As shown in FIGS. 2A and 2B, contacts 106A, 106B are formed above gates 102A, 102B. Contacts 106A, 106B may be located such that the contacts at least partially overlap bends 108A, 108B, respectively. For example, layout 100 may be created (e.g., patterned or designed) such that the contacts at least partially overlap the bends. In some embodiments, portions of contacts 106A, 106B overlap other portions of gates 102A, 102B. In other embodiments, contacts 106A, 106B only overlap portions of bends 108A, 108B of gates 102A, 102B. Because contacts 106A, 106B at least partially overlap bends 108A, 108B, as shown in FIG. 2A, the contacts are shifted or offset away from each other to give more space between the contacts than contacts that lie directly over a non-bending gate (for example, as shown in FIG. 1).

In certain embodiments, as shown in FIG. 2A, a metal layer that includes M1 structures 104A, 104B is formed on the substrate. M1 structures 104A, 104B may be located such that the M1 structures at least partially overlap contacts 106A, 106B, respectively. For example, layout 100 may be created (e.g., patterned or designed) such that the M1 structures at least partially overlap the contacts. M1 structures 104A, 104B may be M1 structures that couple to contacts 106A, 106B. For example, M1 structures 104A, 104B may be metal wires that provide input to gates 102A, 102B, respectively. In some embodiments, M1 structures 104A, 104B may be located such that the M1 structures at least partially overlap bends 108A, 108B of gates 102A, 102B.

Because M1 structures 104A, 104B at least partially overlap contacts 106A, 106B, which at least partially overlap bends 108A, 108B, the M1 structures are shifted or offset away from each other to give more space between the M1 structures. The increased space between M1 structures 104A, 104B provides increased distance between these M1 structures for additional M1 structure 110. M1 structure 110 may be formed as a part of the same metal layer as M1 structures 104A, 104B. M1 structure 110 may be, for example, a metal wire that couples output contact 112A to output contact 112B. Output contacts 112A, 112B may be, for example, contacts to active regions 114A, 114B of layout 100.

Figure 3:
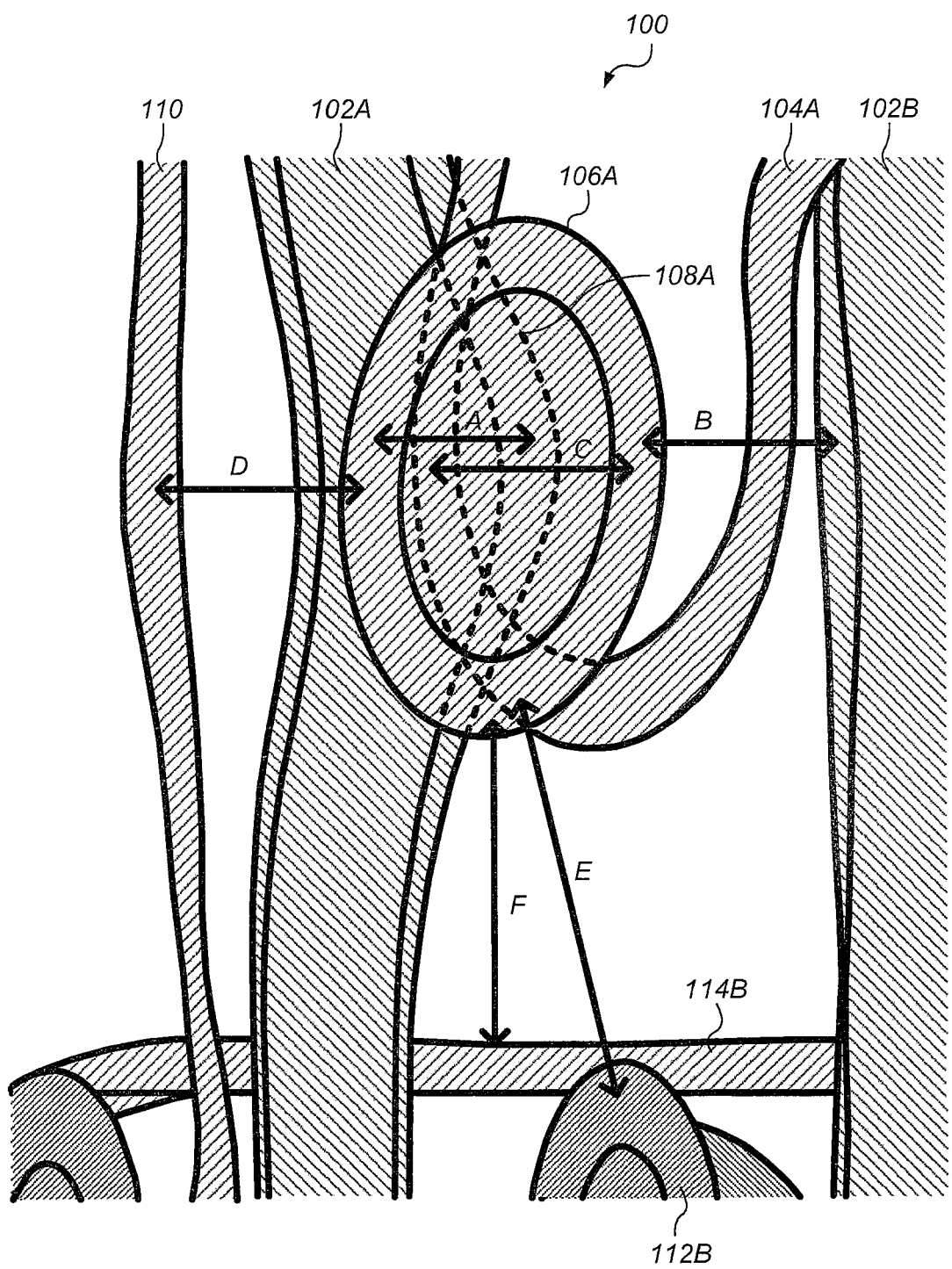
FIG. 3 depicts an enlarged top view of an embodiment of a portion of a layout of a contact and a metal structure shifted over a gate with a bend, as formed on a substrate.

FIG. 3 depicts an enlarged top view of an embodiment of a portion of layout 100 of contact 106A and M1 structure 104A shifted over gate 102A with bend 108A, as formed on a substrate. The portion of layout 100, as shown in FIG. 3, is representative of a layout that may be present on a processed semiconductor substrate (for example, a semiconductor wafer). As shown in FIG. 3, M1 structure 104A overlaps contact 106A and bend 108A of gate 102A. Contact 106A partially overlaps gate 102A and at least partially overlaps bend 108A. Bend 108A in gate 102A allows additional M1 structure 110 to be present on the other side of the gate from M1 structure 104A.

In certain embodiments, layout 100 meets or exceeds minimum overlap and spacing requirements for the layout so that components in the layout (e.g., gate 102A, gate 102B, M1 structure 104A, etc.) can function properly. For example, there may be requirements for values such as, but not limited to:
  (a) the minimum amount of overlap between contact 106A and gate 102A (arrow A in FIG. 3);
  (b) the minimum amount of spacing between contact 106A and gate 102B (arrow B in FIG. 3);
  (c) the minimum amount of overlap between contact 106A and M1 structure 104A (arrow C in FIG. 3);
  (d) the minimum amount of spacing between contact 106A and additional M1 structure 110 (arrow D in FIG. 3);
  (e) the minimum amount of spacing between contact 106A and contact 112B (arrow E in FIG. 3); and
  (f) the minimum amount of spacing between contact 106A and active region 114B (arrow F in FIG. 3).

Factors that may be used in determining the minimum amounts of overlap and/or spacing include, but are not limited to, misalignment error of mask (overlay error), variation of taper in z-direction (sidewall variation), critical dimension uniformity (CDU)(due to lithography effects)(this variation is represented by double lines of structures in FIG. 3), etch process variation (e.g., RIE variation), and electrostatic minimums.

For overlap, the electrostatic minimum may be a number that represents a minimum amount of contact area that is needed between components so that resistance and electromigration remain below selected threshold values. The electrostatic minimum for overlap may be quantified, for example, by assuming that contact 106A is an ellipse and using properties for calculating the area of the ellipse based on the threshold values, or, for example, by using a Monte Carlo simulation. For spacing, the electrostatic minimum may be a number that represents the minimum distance needed for separation to avoid break down of the dielectric used in the space between components.

As an example, values for the minimums, (a)-(f), listed above were calculated for a 22 nm wide gate with a 25 nm wide by 60 nm long bend (bend shifts 25 nm from edge of gate and extends 60 nm in length before bending back to gate edge). The contact was a 40 nm wide by 80 nm long contact that was shifted 30 nm off-center to overlap the bend. The minimum values for overlay error, sidewall variation, CDU, and RIE variation were calculated using 4 sigma RSS (root-sum-square) values. Electrostatic minimums were found assuming the contact had the area of an ellipse with a 60 nm major axis and thresholds were set to have 50% nominal contact area. The minimum values were found to be approximately: (a) 22 nm; (b) 21 nm; (c) 28 nm; (d) 28 nm; (e) 30 nm; and (f) 22 nm.

The calculated minimum values were compared to values found using PVBAND simulation to generate a layout similar to layout 100 shown in FIGS. 2A and 3. The layout generated by the PVBAND simulation was found to satisfy all the minimum requirements found by the calculations. Thus, the layout was found to be feasible for implementation using current lithography tools and the layout may be produced without additional process layers and/or development beyond current processing technologies other than the implementation of bends in the gates and retargeting of the locations of contacts and M1 structures.

FIGS. 4 and 5 depict retargeted (for optimized process integration) and an on-wafer depictions of layout 100 shown in FIG. 2A. The embodiment of layout 100 depicted in FIG. 4 may be optimized for process integration so that minimum overlap and spacing requirements are achieved even with errors in processing or design. In some embodiments, other features besides gates 102A, 102B may include bends to further reduce the potential impact of processing errors on critical dimensions of layout 100. For example, as shown in FIG. 4, M1 structures 104A, 104B, additional M1 structure 110, and active regions 114A, 114B include small bends. Bends in M1 structures and/or active regions may be formed by starting with thick structures and cutting out notches in where bends are needed or starting with thin structures and expanding the structures everywhere except where bends are needed.

Figure 6:
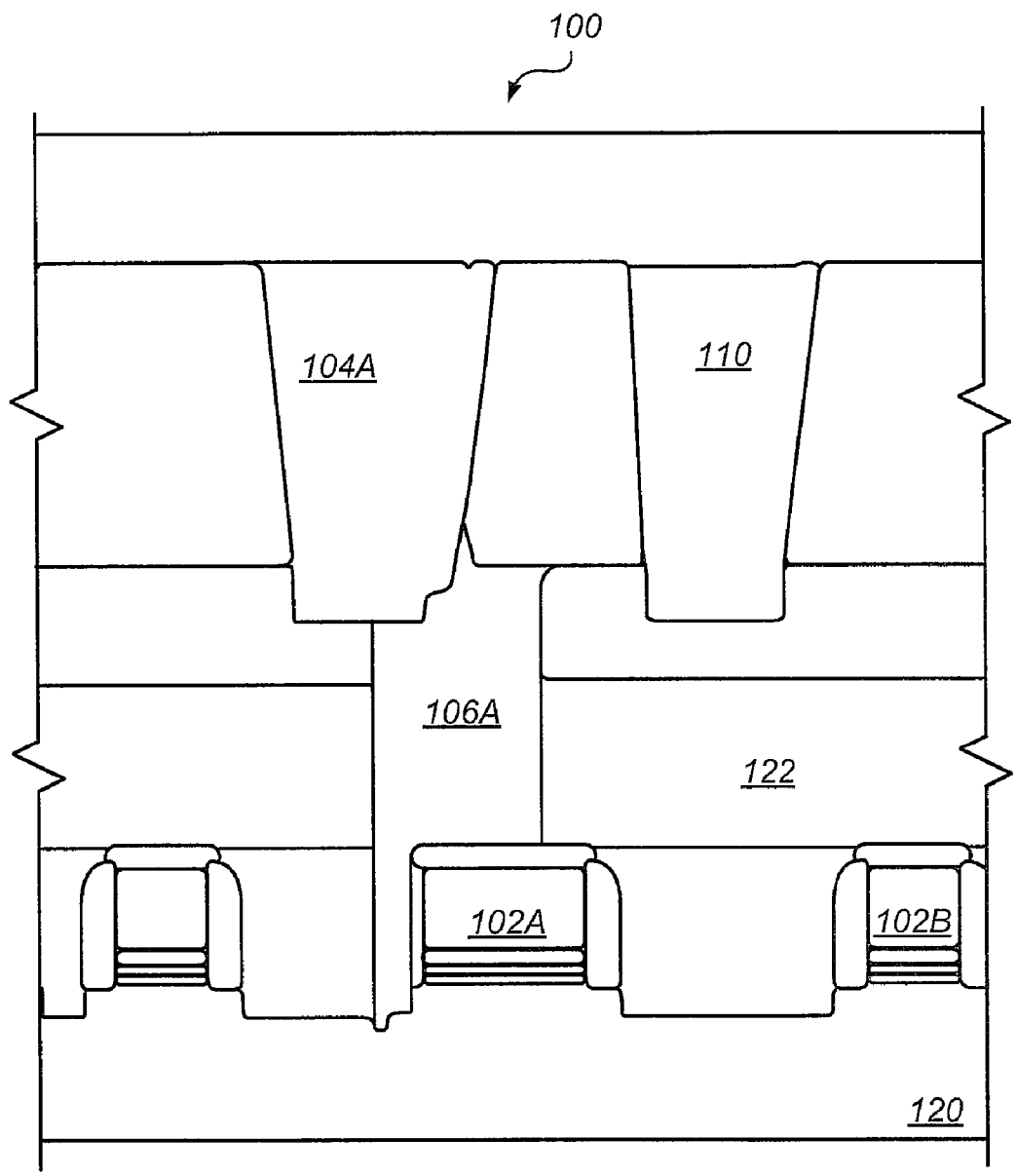
FIG. 6 depicts a cross-sectional side view of an embodiment of a layout with a contact and a metal layer structure shifted over a gate, as formed on a substrate.

FIG. 6 depicts a cross-sectional side view of an embodiment of layout 100 with contact 106A and M1 structure 104A shifted over gate 102A, as formed on substrate 120. As shown in FIG. 6, contact 106A is formed through insulating layer 122. Contact 106A may be at least partially shifted from gate 102A and M1 structure 104A. A bend (not shown) in gate 102A allows contact 106A to be shifted from gate 102A while providing sufficient connection between the contact and the gate. Shifting of contact 106A and M1 structure 104A allows additional M1 structure 110 to be located between gate 102A and gate 102B.

Figure 7:
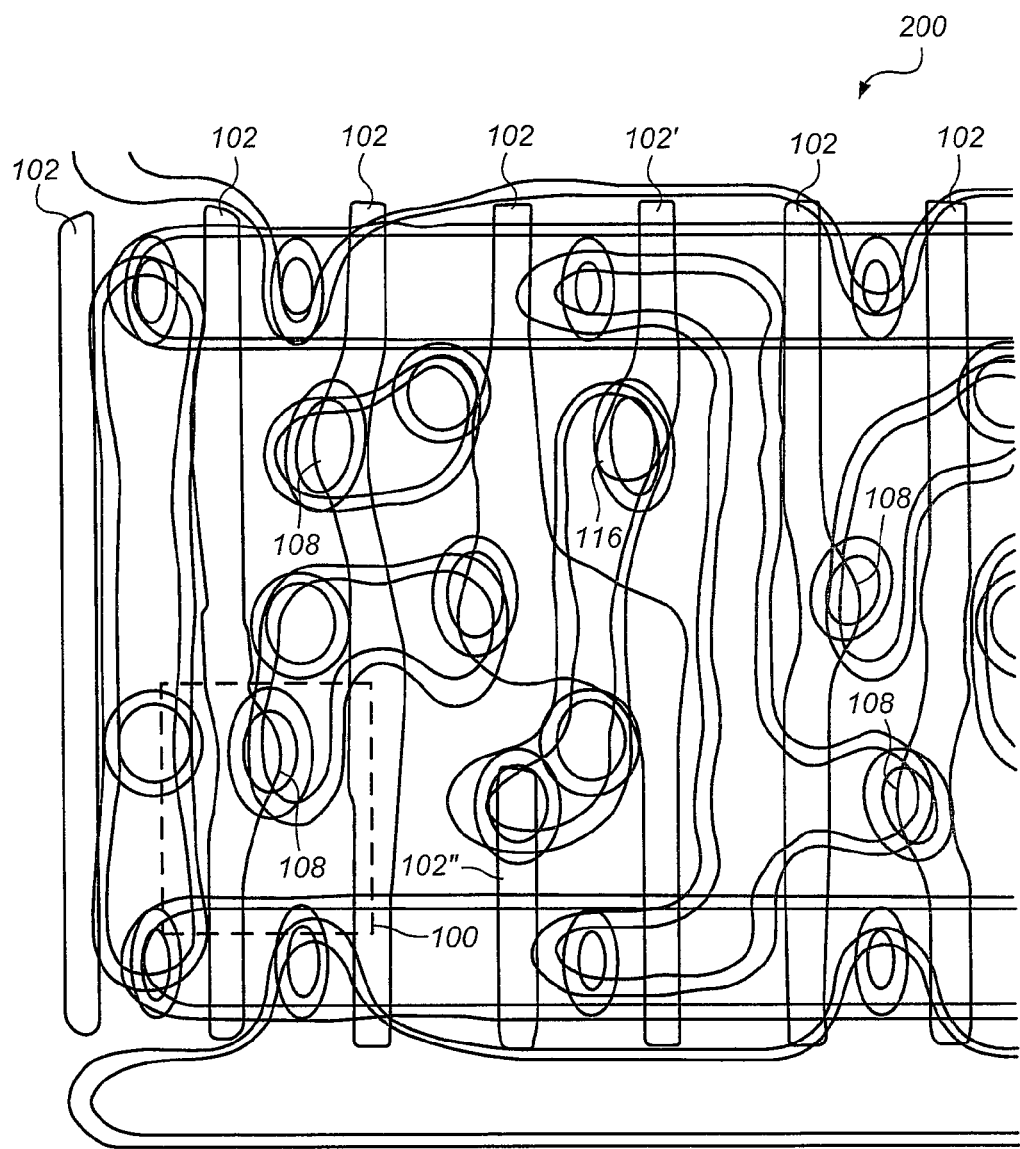
FIG. 7 depicts a top view of an embodiment of a layout with several contacts and metal layer structures shifted over gates with bends, as formed on a substrate.

FIG. 7 depicts a top view of an embodiment of layout 200 with several contacts and metal layer structures shifted over gates with bends, as formed on a substrate. FIG. 7 is a representation of a larger layout that may include layout 100 shown in FIGS. 2A, 3, 4, and 5. For reference, layout 100 is outlined as a portion of layout 200 in FIG. 7. Layout 200 may be, for example, a flop layout used for a GPU. Layout 200 may include several gates 102, some of which include bends 108. For simplicity, contacts, M1 structures, and active regions are not labeled in FIG. 7. Layout 200 shows that the use of bends in gates and contacts inhibits bloat in the layout and allows for a denser layout that may produce faster and more reliable CPUs or GPUs.

FIG. 7 depicts an embodiment of gate 102' with ½ bend 116. Gate 102' may be cross-coupled to another gate (for example, gate 102"). Because gate 102' is cross-coupled, the gate terminates after only a ½ bend and the full bend is not needed. In addition, gate 102" is an example of a gate with the contact centered over the gate. Thus, the embodiment depicted in FIG. 7 shows that gates with contacts centered over the gate may be included in the same layout as gates with bends and contacts partially overlapping the gates and, in some embodiments, these different types of gates and contacts can be in reasonable close proximity to each other.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed:

1. A semiconductor device, comprising:
    a gate on a semiconductor substrate, wherein one side wall of the gate comprises at least one protrusion and an opposite side wall of the gate comprises at least one depression;
    an insulating layer disposed substantially over the gate;
    a contact formed through the insulating layer, wherein the contact at least partially overlaps at least one of the protrusions in the gate; and
    a metal layer disposed on the insulating layer, wherein the metal layer comprises a first structure shifted to a first side of the gate, and wherein the first structure at least partially overlaps the contact such that the contact electrically couples the first structure to the gate through the insulating layer.

2. The device of claim 1, wherein at least one of the protrusions and at least one of the depressions are substantially opposite one another along a portion of a length of the gate.

3. The device of claim 2, wherein the protrusion and depression are substantially opposite one another along a portion but not all of the length of the gate.

4. The device of claim 1, wherein the first structure at least partially overlaps at least one of the protrusions in the gate.

5. The device of claim 1, wherein the first structure does not overlap an additional gate on the other side of the first structure opposite the gate.

6. The device of claim 1, wherein at least one of the protrusions in the gate and at least one of the depressions in the gate allow a second structure in the metal layer to be located between the gate and at least one additional gate.

7. The device of claim 1, further comprising a second structure in the metal layer located on a second side of the gate opposite from the first side of the gate, wherein the second structure is electrically isolated from the first structure.

8. The device of claim 7, wherein the second structure does not overlap the gate.

9. The device of claim 7, wherein the second structure does not overlap an additional gate on the side of the second structure opposite the gate.

10. The device of claim 7, further comprising an additional gate on the semiconductor substrate, wherein the additional gate is located on the opposite side of the second structure from the gate, and wherein the second structure does not overlap the gate or the additional gate.

11. The device of claim 7, further comprising at least one additional contact formed in the insulating layer, wherein the additional contact is configured to couple an active region of the device to the second structure through the insulating layer.

12. The device of claim 1, wherein the protrusions and the depressions in the gate are formed according to a CAD (computer-aided design) designed pattern.

13. A semiconductor device fabrication process, comprising:
    forming a gate on a semiconductor substrate, wherein one side wall of the gate comprises at least one protrusion and an opposite side wall of the gate comprises at least one depression;
    forming an insulating layer substantially over the gate;
    forming a contact through the insulating layer, wherein the contact at least partially overlaps at least one of the protrusions in the gate; and
    forming a metal layer on the insulating layer, wherein the metal layer comprises a first structure shifted to a first side of the gate, and wherein the first structure at least partially overlaps the contact such that the contact electrically couples the first structure to the gate through the insulating layer.

14. The process of claim 13, further comprising forming at least one of the protrusions and at least one of the depressions substantially opposite one another along a portion of a length of the gate.

15. The process of claim 14, wherein the protrusion and the depression are substantially opposite one another along a portion but not all of the length of the gate.

16. The process of claim 13, further comprising locating the first structure such that the first structure does not overlap an additional gate on the other side of the first structure opposite the gate.

17. The process of claim 13, further comprising forming a second structure in the metal layer located on a second side of the gate opposite from the first side of the gate.

18. The process of claim 17, further comprising locating the second structure such that the second structure does not overlap the gate.

19. The process of claim 17, further comprising locating the second structure such that the second structure does not overlap an additional gate on the other side of the second structure opposite the gate.

20. The process of claim 17, further comprising forming an additional gate on the semiconductor substrate, wherein the additional gate is located on the opposite side of the second structure from the gate, and wherein the second structure does not overlap the gate or the additional gate.

21. The process of claim 17, further comprising forming at least one additional contact in the insulating layer to couple an active region of the device to the second structure through the insulating layer.

22. The process of claim 13, further comprising forming the protrusions and the depressions in the gate based on a CAD (computer-aided design) designed pattern.

23. An integrated circuit comprising one or more semiconductor devices, wherein at least one of the semiconductor devices comprises:

- a gate on a semiconductor substrate, wherein one side wall of the gate comprises at least one protrusion and an opposite side wall of the gate comprises at least one depression;
- an insulating layer disposed substantially over the gate;
- a contact formed through the insulating layer, wherein the contact at least partially overlaps at least one of the protrusions in the gate; and
- a metal layer disposed on the insulating layer, wherein the metal layer comprises a first structure shifted to a first side of the gate, and wherein the first structure at least partially overlaps the contact such that the contact electrically couples the first structure to the gate through the insulating layer.

* * * * *